United States Patent
Chiang et al.

(10) Patent No.: US 6,259,266 B1
(45) Date of Patent: Jul. 10, 2001

(54) TESTING DEVICE AND METHOD FOR KNOWN GOOD CHIP

(75) Inventors: Cheng-Lien Chiang, Taipei; Shyi-Ching Liau, Hsinchu, both of (TW)

(73) Assignee: Apack Technologies Inc., Hsinchu (TW)

( * ) Notice: Subject to any disclaimer, the term of this patent is extended or adjusted under 35 U.S.C. 154(b) by 0 days.

(21) Appl. No.: 09/179,408

(22) Filed: Oct. 27, 1998

(51) Int. Cl.⁷ .................................................. G01R 31/28
(52) U.S. Cl. ........................................ 324/765; 324/754
(58) Field of Search .................................. 324/765, 757, 324/754; 29/840, 841

(56) References Cited

U.S. PATENT DOCUMENTS 4,237,607 * 12/1980 Ohno ...................................... 29/840
5,007,163 * 4/1991 Pope et al. ............................. 29/840

* cited by examiner

Primary Examiner—Ernest Karlsen
(74) Attorney, Agent, or Firm—McDermott, Will & Emery

(57) ABSTRACT

A testing means for holding chips to perform tests comprises of a plurality of inner leads for providing electrical connection for the chips with a plurality of conductive bumps. A metal layer is formed on surfaces of the plurality of inner leads for fixing the chips on the plurality of inner leads, wherein a melting point of the metal layer is below a melting point of the conductive bumps. Then, a adhesive material is pasted on a bottom surface of the plurality of inner leads for fixing the plurality of inner leads. A holding means is used to connect and hold the plurality of inner leads, and used for providing electrical connection for the plurality of inner leads.

12 Claims, 8 Drawing Sheets

TESTING DEVICE AND METHOD FOR KNOWN GOOD CHIP

FIELD OF THE INVENTION

The present invention relates to a testing device, and more specifically, to a testing device for holding chips to provide electrical connection between the chips and testing apparatuses.

BACKGROUND OF THE INVENTION

Integrated circuits (IC) manufactures are constantly striving to reduce semiconductor device sizes. It has been the trend in integrated circuit (IC) technology to make small, high speed and high-density devices. Thus, the density of semiconductor devices per unit area of silicon wafer is increased. However, the high density integration of circuits makes the process more difficult, and also makes the testing methods more difficult for ensuring and promoting the qualities of the devices which are produced. For example, various testing methods are required for the chips between performing the step of dividing wafers to chips and packaging the chips completely. Wherein some testing methods are used to ensure the completed package devices conforming to functional and life-time requirements. Besides, low cost and much time efficiency for performing the various testing methods are important concerned issues.

In general, all tests performed before the chips divided from the wafers are called wafer level tests, such as CP1, CP2, WAT and so on. The WAT tests are used for sampling wafers under inspecting control in wafer process. The WAT tests, such as dielectric test, low voltage field effect transistor and high voltage field effect transistor tests (LVFET & HVFET testing), P-N junction test, OPEN/SHOT test and so on, are used for real-time controlling the qualities of wafers in processes. The CP1 tests comprise of the OPEN/SHOT test and some gross tests, and the CP2 tests comprise of the full function test for the chips on wafers. It is noted that the laser-repairing processes are used to promote the qualities and yields of some chips that can be amended, such as chips for memory, before performing the CP2 tests. In addition, the tests described above within a temperature range about from −5° C./90 ° C. to 105° C. are used for eliminating some chips which will cause breakdown easily in order to ensure the chips retained all have good qualities, and can maintain a longer life-time.

The tests for testing the chips, such as memory chips, in the period between dividing the chips from the wafers and completing the packages of chips are called chip level tests. Wherein the chip level tests comprising of FT1, FT2, FT3 and so on tests, are used for performing some tests which can't be done in wafer level tests, and for providing testing conditions much temperature differences for testing the chips, in order to eliminate some chips with defects and ensure the qualities and operating life-time of package devices satisfying the requirements. There is a burn-in process for accelerated maturing the chips between performing FT1 tests (namely the open shot & gross tests) and FT2 tests (namely full function test). The burn-in process is used for rapidly eliminating some devices which will breakdown prematurely, in order to ensure the packaged devices maintaining a longer life-time required. Briefly, there is a series of precondition and testing process used to promote the reliable capacities of the package devices. The relations between the developments of packaging models and testing methods are closely. Any packaging model that cannot be used for performing tests and costs much will be eliminated unless with some special functions that others cannot perform.

However, for the chips just packed to the substrate using the flip chip bumps but packaging, it's difficult to perform FT1, FT2, and FT3 tests except the wafer level tests, such as CP1, CP2, WAT and so on. The main factor of above issues is that it is difficult to hold the fine chips and execute the sequential testing processes by using current apparatus and testing methods. It is required to develop the new testing apparatus for solving the issues above. Especially, the developments of the trays used to hold the chips, the drawer used for drawing the chips, automatic loading & unloading system, the test socket and so on, will cost much since there is not any unified standards.

Besides, the tolerance of conducting points located on chips for tests is generally below 20 $\mu$m. Relatively, the tolerance of the testing apparatus produced according to the prior technique is more than 25 $\mu$m. The tolerances caused the more incorrect judgements easily. Currently, the precisely alignment between the outer leads of the testing devices and the conducting points of the test sockets are obtained by deciding the exterior sizes and the allowed tolerance of the testing devices. However, the testing methods can't apply to test the chips without packages unless the pitches of testing points and the conducting area can overcome the tolerance caused by alignments between the testing devices and test sockets. Another solution is using a vision system added on the testing apparatus to make the alignment more precisely. In conclusion, it's essential to manufacture test sockets by using the techniques of producing chips and to test the chips by using a vision system for alignments whether the redistribution of the testing points of chips is performed, in order to avoid incorrect judgements and complete testing chips with any size. A novel method according to present invention is proposed to perform the tests for chips with flip chip bumps by using the current test apparatuses. The tests performed comprise of the FT1, FT2, and BURN-IN tests. The qualities and operating life-time for the chips located on the substrate are under control by using the method proposed according the present invention.

SUMMARY OF THE INVENTION

The prime object of the present invention is to provide a testing means for testing the chips by using the original testing apparatuses directly.

It is another object of the present invention to provide a novel testing method for testing the chips produced by chip level tests.

It is a further object of the present invention to provide a testing means to be the electrical connection interface between the chips and the testing apparatuses.

A testing means for holding chips to perform tests comprises of a plurality of inner leads for providing electrical connection for the chips with a plurality of conductive bumps. A metal layer is formed on surfaces of the plurality of inner leads for fixing the chips on the plurality of inner leads, wherein a melting point of the metal layer is below a melting point of the conductive bumps. Then, a adhesive material is pasted on a bottom surface of the plurality of inner leads for fixing the plurality of inner leads. A holding means is used to connect and hold the plurality of inner leads, and used for providing electrical connection for the plurality of inner leads.

A testing method proposed in the present invention for testing chips comprises the following steps. First, the chips are connected on a leadframe, wherein the leadframe is used for holding the chips, and the leadframe has a plurality of inner leads for electrically connecting to a testing apparatus, and the chips have a plurality of conductive bumps for connecting to the plurality of inner leads. Then, various testing steps are performed to ensure and control qualities of the chips. The chips are departed from the leadframe by a thermal process, namely the plurality of conductive bumps of the chips are departed from the plurality of inner leads of the leadframe.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION IF THE PREFERRED EMBODIMENT

The present invention discloses a novel method and a novel device to test a chip 40 with flip chip bumps 50 by fixing the chip 40 on a leadframe 500 temporary. The chip 40 can easily depart from the leadframe 500 after performing all the tests, such as burn-in test and so on. The quality of the chip 40 can be ensured by using the testing method and device according the present invention. Wherein the leadframe 500 is designed to fix the chip 40 on the leadframe 500 and to depart the chip 40 from the leadframe 500 easily. Especially, all kind tests can be performed by using the current testing apparatuses due to the size of the leadframe 500 can satisfy the test sockets used currently. It can reduce the cost of development for testing apparatuses and processes.

Figure 1:
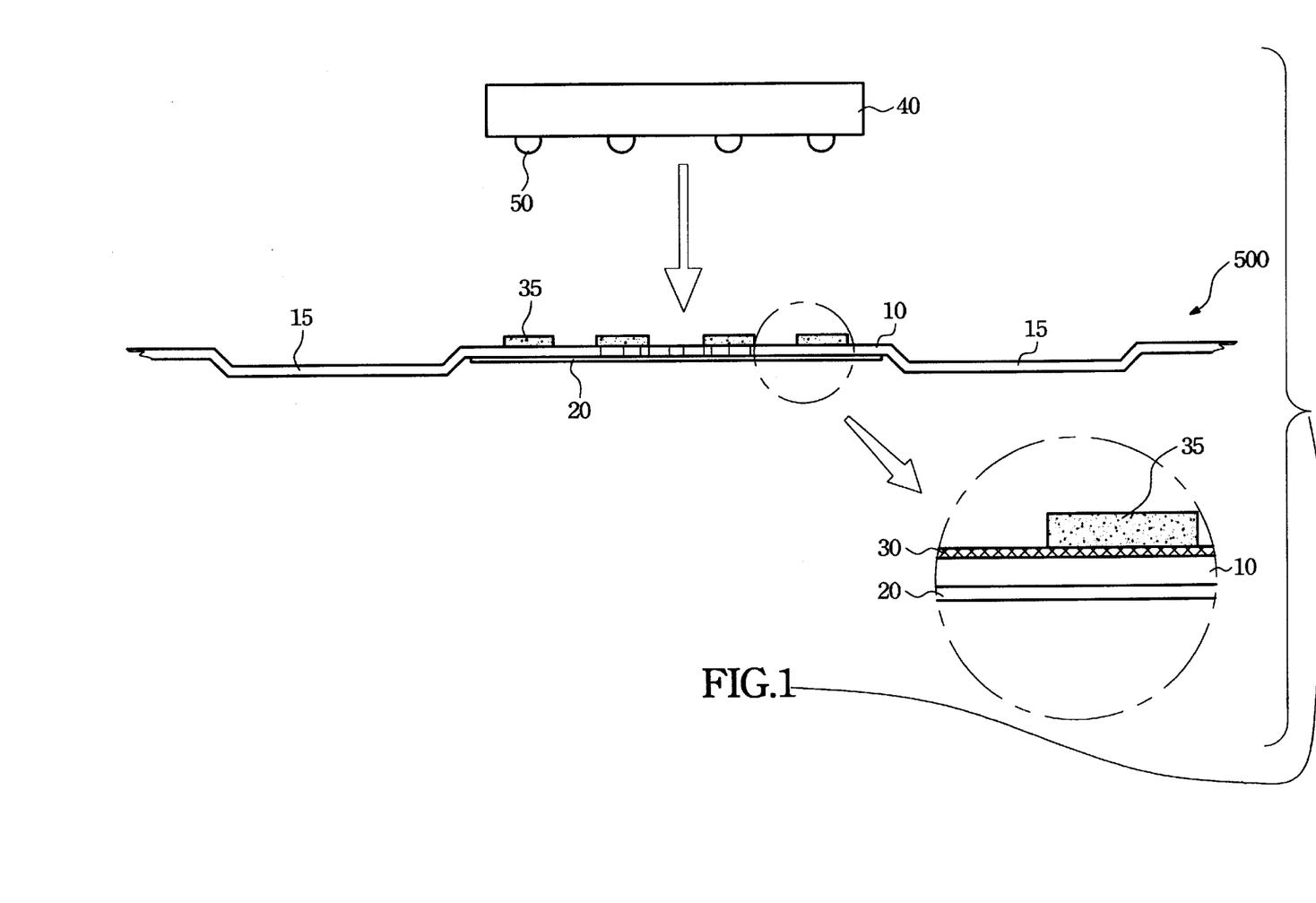
FIG. 1 is a cross sectional view of a leadframe illustrating the structure of the leadframe in accordance with the present invention.

Referring to FIG. 1, in a preferred embodiment, the leadframe 500 is provided to have a chip 40 with flip chip bumps 50 fixing on it temporary, in order to perform the test steps. The leadframe 500 comprises of inner leads 10 and outer leads 15, and a adhesive material 20 formed on a bottom surface of the inner leads 10. Wherein the outer lead area is indented a depth from the surface the leadframe 500. In a embodiment, a tape can be utilized to act as the adhesive material 20. Wherein the adhesive material 20 must be enough to cover the whole inner lead area at least. The adhesive material 20 is used to confirm the displacement along the X and Y axes directions and the common planarity along the Z axis direction within a allowed tolerance when the chip 40 is located on the inner leads 10. Besides, a metal layer 30 is formed on the surface of the leadframe 500, wherein the metal layer 30 must cover the whole inner lead area at least, and the melting point of the metal layer 30 must be below the flip chip bumps 50 on the chip 40. A medium layer 35 formed on the metal layer 30 is used to couple with the inner leads 10 and flip chip bumps 50.

In a preferred embodiment, the leadframe 500 described above is made of metal materials, and the metal layer 30 coated on the surface of the leadframe 500 is made of wettability material. The wettability metal layer 30 must cover the whole inner lead area at least, and the melting point of the wettability metal layer 30 are below the melting point of the flip chip bumps 50 located on the chip 40. In general, the wettability metal layer 30 comprises of the solder, and the medium layer 35 formed on the metal layer 30 is comprised of the flux and solder paste.

Figure 2:
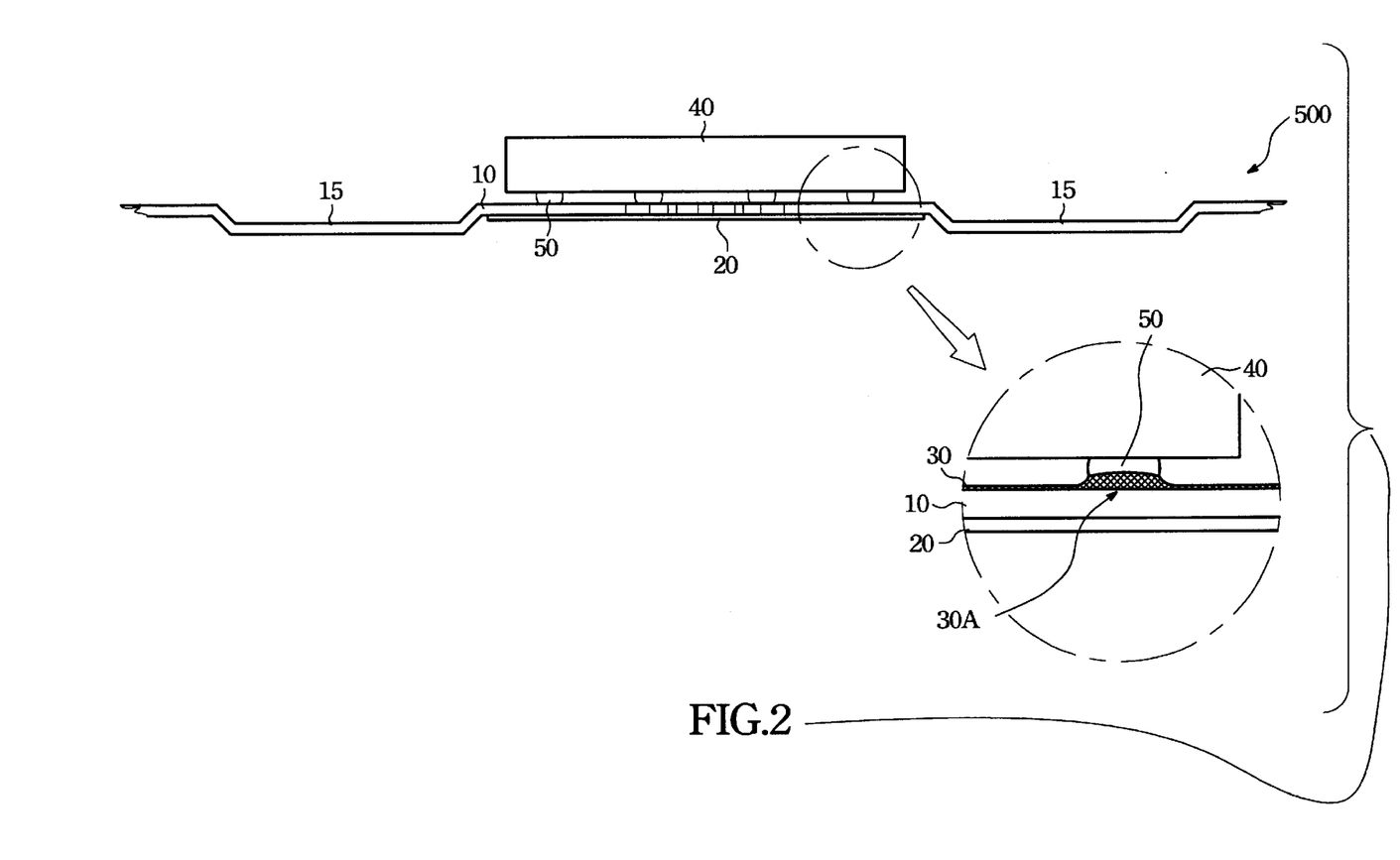
FIG. 2 is a cross sectional view illustrating the structure of the leadframe with a testing chip formed on it in accordance with, the present invention.

Then, referring to FIG. 2, the chip 40 is connected on the leadframe 500. At first, the chip 40 is located on the inner leads 10 to make precisely alignment between the flip chip bumps 50 and the inner leads 10. As described above, the medium layer 35 is formed on the inner leads 10 for electrically coupling between the inner leads 10 and the flip chip bumps 50. It's noted that the wettability metal layer 30 coated on the leadframe 500 will gather to the surfaces of the flip chip bumps 50 after performing a thermal process when the medium layer 35 is made of flux, as illustrated by arrow 30A in FIG. 2. Relatively, when the medium layer 35 is made of solder paste, both the wettability metal layer 30 and the solder paste will melt after the thermal process. The melting solder paste around the flip chip bumps 50 will flow to the surfaces of the leadframe 500 due to the surface tension of the melting solder paste, and cause the structure of connection portion between the flip chip bumps 50 and the inner leads 20 located on the leadframe 500 as illustrated by the arrow 30A in FIG. 2. Besides, whether the flux or solder paste used to form the medium layer 35 is dependant on height difference level for one bump and each other among the flip chip bumps 50. The medium layer 35 can made of flux when the wettability metal layer 30 coated on the surfaces of the leadframe 500 could accept the height difference level between one bump and each other among the flip chip bumps 50.

In addition, it's important to depart the chip 40 from the inner leads 10 located on the leadframe 500 easily just by a thermal process, since the prime objective of the present invention is to fix the chip on the inner leads 10 for performing the chips tests more convenient. It is important to prevent the much residual wettability material from causing the reliability of the packaging chip reduced after the chip 40 departed from the inner leads 10. Wherein the much residual wettability material is caused by forming a thick wettability metal layer 30 between the inner leads 10 and the flip chip bumps 50. Relatively, It's also important to prevent conducting points between the inner leads 10 and the flip chip bumps 50 from being cracked easily in testing process, wherein the cracked caused generally by forming a thin wettability metal layer 30 therein. In a preferred embodiment, a electroplating tin-lead(Sn:80%/Pb:20%) is formed on the surfaces of the leadframe 500 by using the tin-lead electroplating-trough to electroplate the leadframe 500. It's noted that the melting point of the wettability metal layer 30 can be adjusted below the melting points of the flip chip bumps 50 by controlling the components of the wettability metal layer 30.

Figure 3:
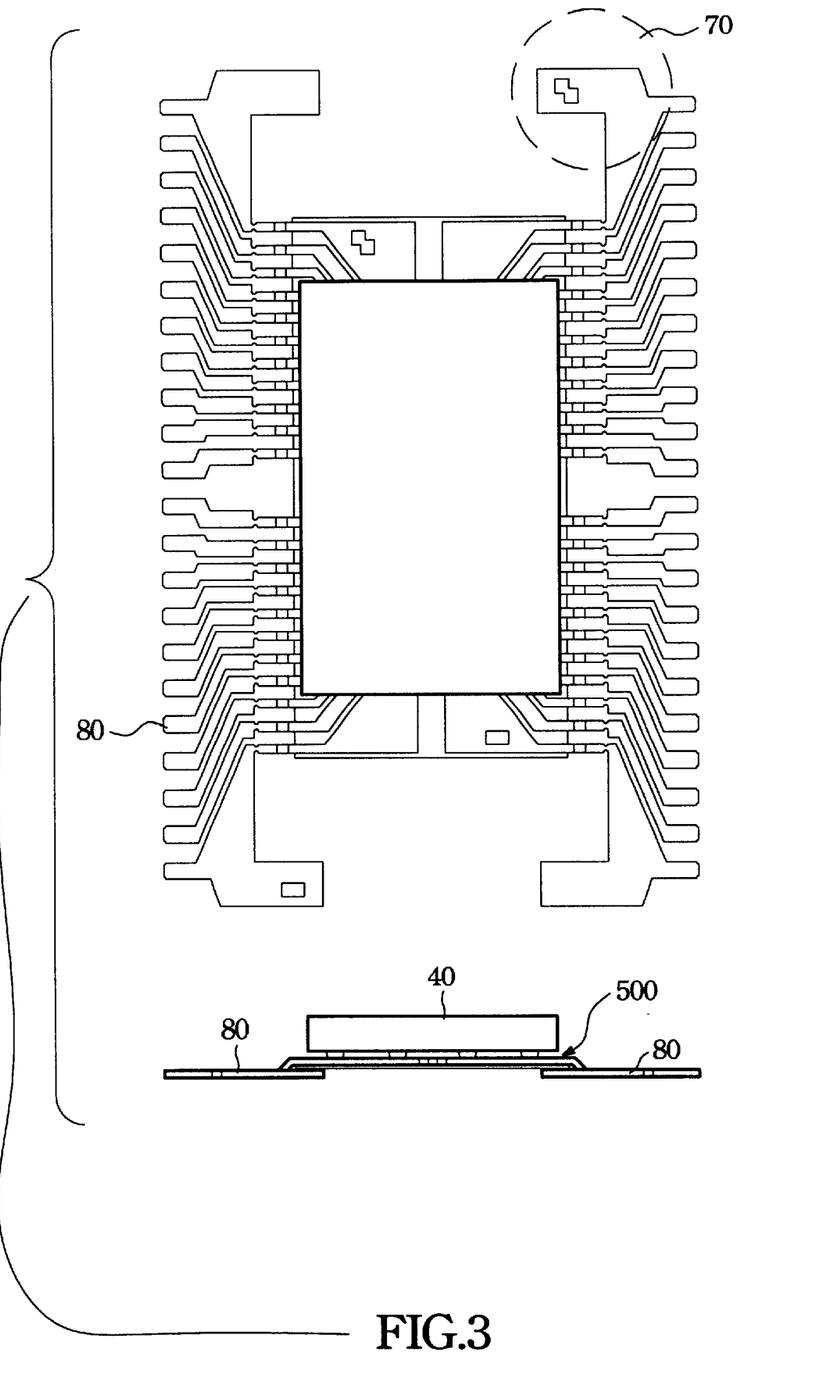
FIG. 3 is a cross sectional view and a top view of a holding device in accordance with the present invention.

Then, referring to FIG. 3, the outer lead area(shown in FIG. 1) is cut off from the leadframe 500 after the step of fixing the chip 40 on the leadframe 500 performed. The leadframe 500 is located on a holding device 80 that has protruding portions 70. The protruding portions 70 are designed for meeting and satisfying the requirement of current testing apparatus. Namely, they have to suit for the JEDEC standards, and can be located in the testing sockets used currently. One of the functions for the protruding portions 70 is to align the leadframe to the testing socket. Therefore, the protruding portions 70 are optional elements and any elements with equal function can be used to replace the protruding portions 70. For example, the alignment elements 70 may be designed with any shape to fit other type of testing apparatus. The holding device 80 satisfies the current automatic testing apparatuses for performing tests by using the protruding portions 70. In a preferred embodiment, the holding device 80 is completely suitable for tsop(II) 44-pin testing apparatus, wherein the tsop(II) 44-pin testing apparatus comprises of the holding tray, loading system with automatic capsules, high fix sockets (namely the socket has a capacity of 32–64 piece of devices for performing tests) and so on. It does not need any other change for the hardware of testing apparatuses for performing the testing steps. Thus, the chips with flip chip bumps 50 can be tested by the testing apparatuses currently used, and the test methods are performed with less cost and higher yields.

Figure 4:
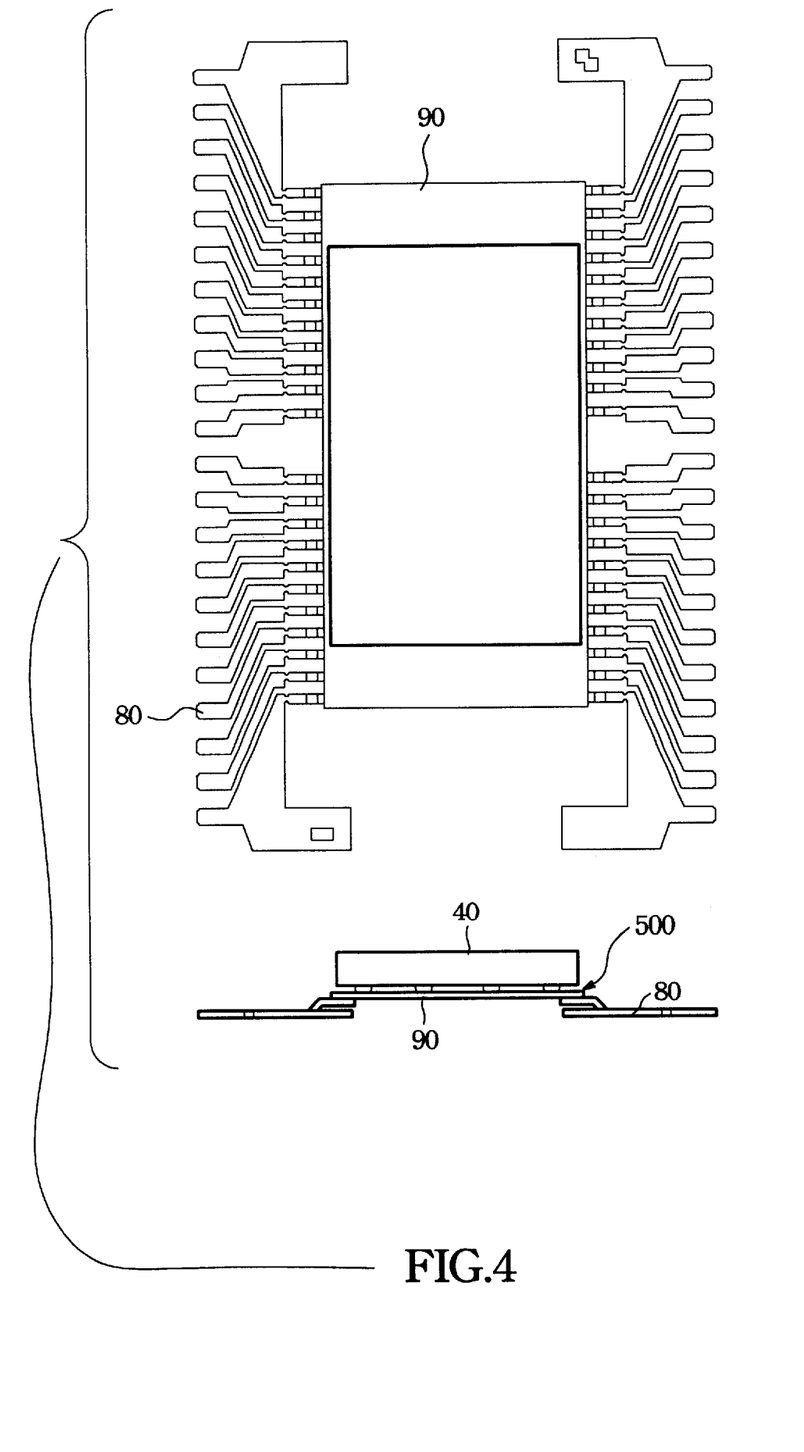
FIG. 4 is a cross sectional view and a top view of a holding device in accordance with another embodiment in the present invention.

Besides, referring to FIG. 4, another embodiment is proposed. Because the leadframe 50 can't used to fan-out the I/O of the chips with much more I/O pins and less areas, the inner leads 10 and fixed adhesive material 20 can be replaced by circuit boards and softly circuit boards 90 in order to test the chips with much I/O pins by using the techniques according to present invention.

Figure 5:
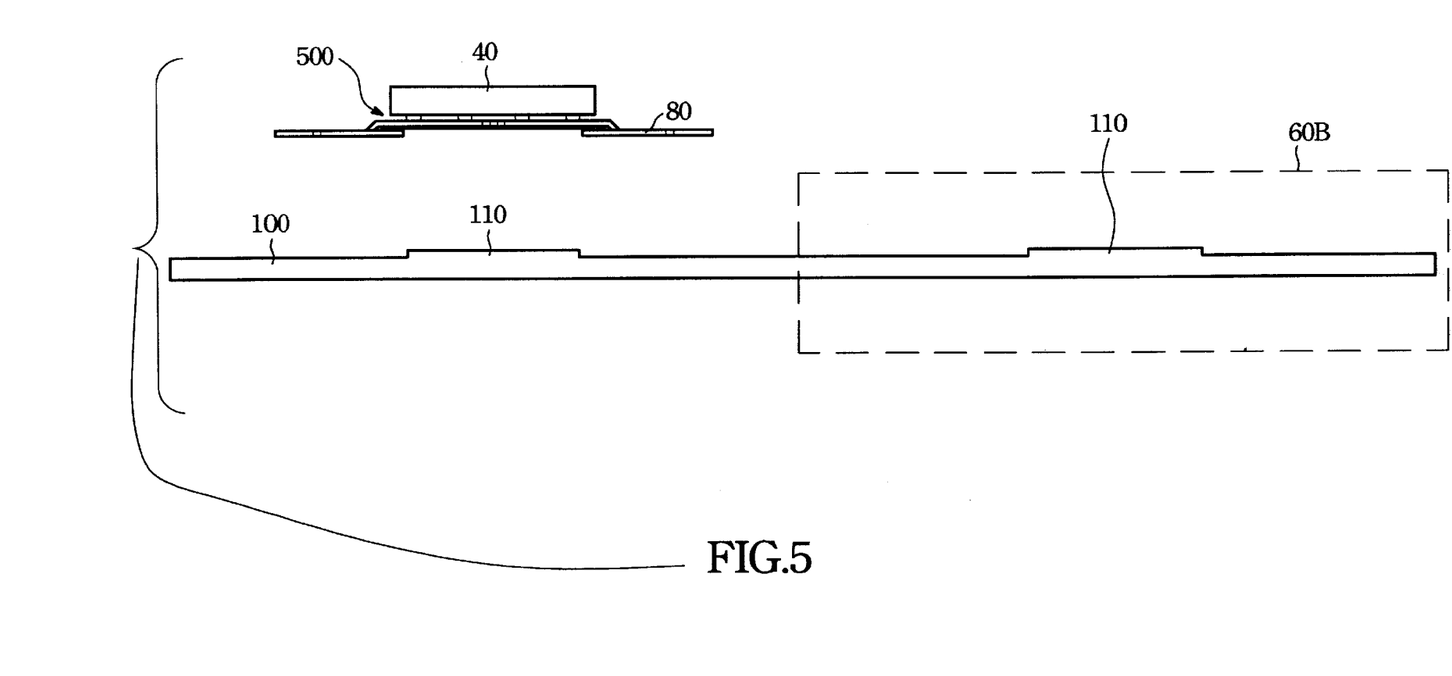
FIG. 5 is a cross sectional view of a protection device in accordance with the present invention.
Figure 6:
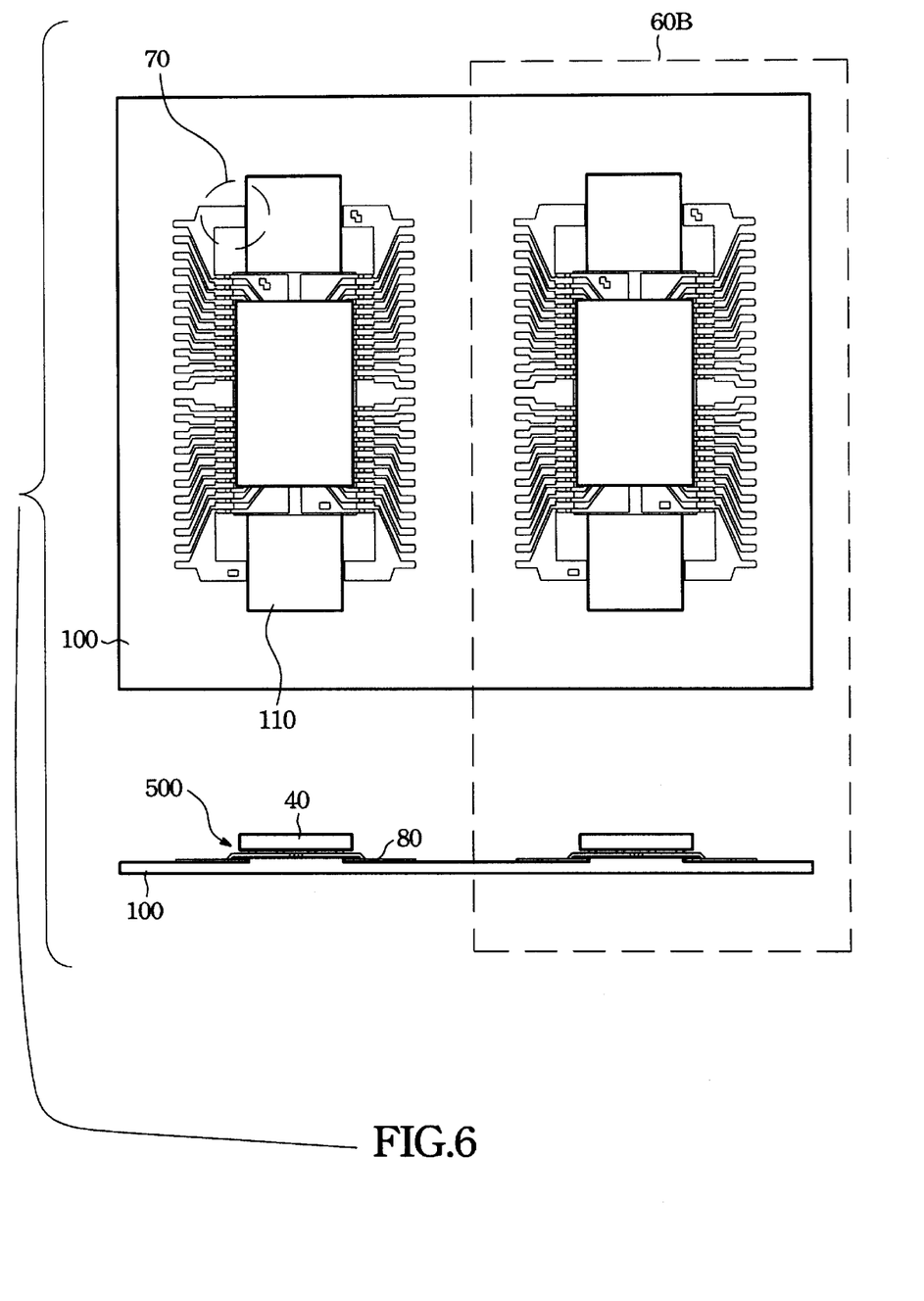
FIG. 6 is a cross sectional view illustrating the step of locating the holding device on the protection device in accordance with the present invention.
Figure 7:
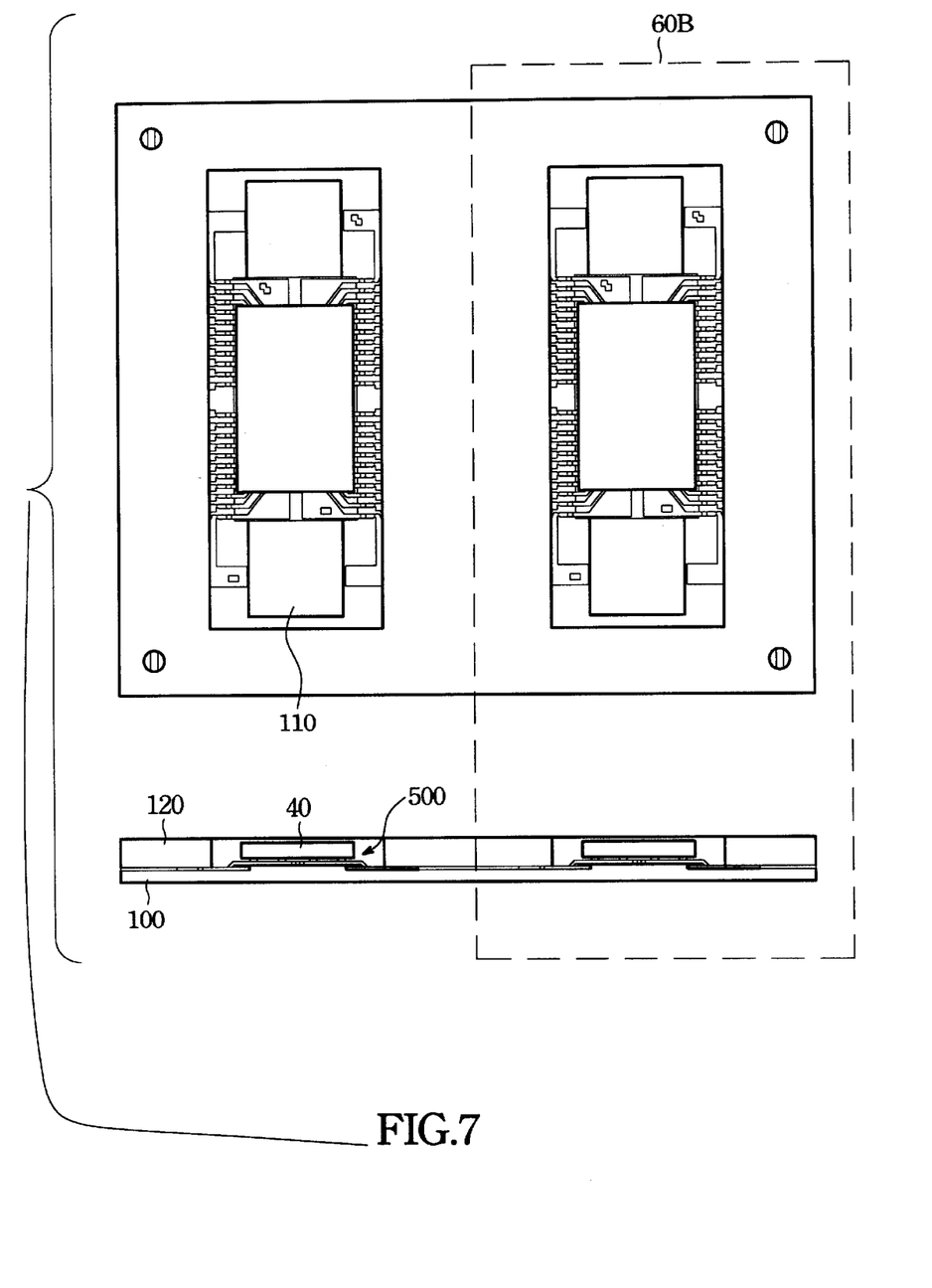
FIG. 7 is a cross sectional view illustrating the step of locating the holding device on the protection device in accordance with the present invention.

Referring to FIG. 5 & FIG. 6, the holding device 80 according to present invention is located on a guide-rail 110 after the FT1, BURN-IN, FT2 . . . , etc. test is performed, wherein the guide-rail 110 is located on a bottom plate 100. Then, referring to FIG. 7, a cover plate 120 is covered on the bottom plate 100 in order to fix and protect the holding device 80. The area 60B in FIG. 5 & FIG. 7 indicates the bottom plate 100 with at least one guide-rail 110 to locate at least one holding device 80 for performing tests.

Figure 8:
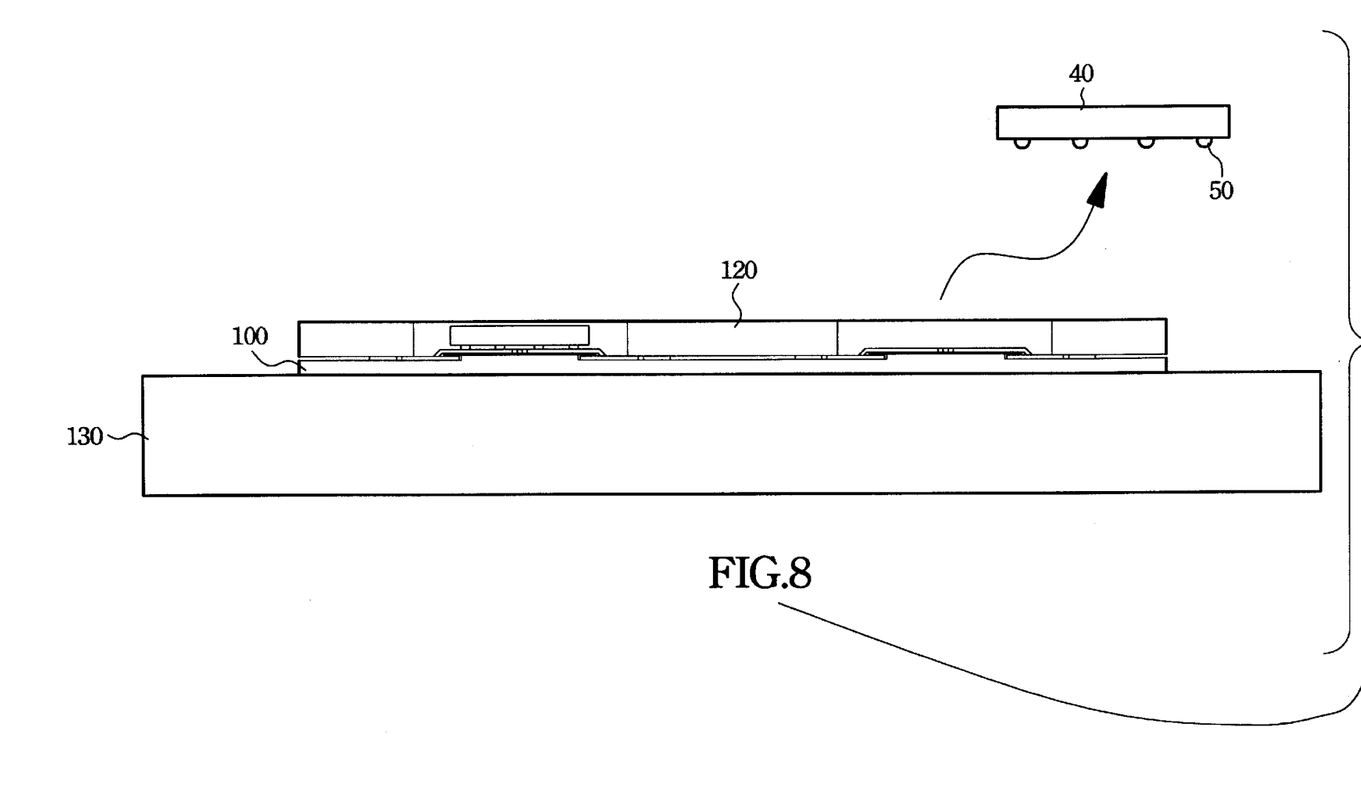
FIG. 8 is a cross sectional view illustrating the step of departing the chips from the leadframe by using a thermal process in accordance with the present invention.

Referring to FIG. 8, the bottom plate 100 with the holding devices 80 and covered by the cover plate 120 is located on a heating plate 130. As described above, the chip 40 with flip chip bumps 50 is departed from the leadframe 500 by melting the wettability metal layer 30 since the melting point of the wettability metal layer 30 is below the melting point of the flip chip bumps 50. Thus, the known good chips can be obtained after completing the FT1, BURN-IN, and FT2 tests.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A holding assembly for holding a chip to perform a test, comprising:
    a plurality of inner leads, for electrically connecting a chip to a plurality of conductive bumps, wherein each of the inner leads has a top surface and a bottom surface, and wherein each of the conductive bonds has a first melting point;
    a metal layer on the top surface of each of the inner leads, for fixing the chip on each of the inner leads, wherein the metal layer has a second melting point below the first melting point;
    an adhesive material on and adjacent to the bottom surface of each of the inner leads, for adhering each of the inner leads to a guide rail on a bottom plate; and
    a holder on the bottom plate, for holding, physically connecting, and electrically connecting to the inner leads.

2. The holding assembly of claim 1, wherein the holder further comprises a plurality of protrusions for aligning the holding assembly with a testing socket.

3. The holding assembly of claim 1, further comprising a medium layer on the metal layer, wherein the medium layer serves as an interface between the conductive bumps and the metal layer and has a third melting point below the first melting point.

4. The holding assembly of claim 3, wherein the medium layer is comprised of a flux.

5. The holding assembly of claim 3, wherein the medium layer is comprised of a solder paste.

6. The holding assembly of claim 1, wherein the metal layer is comprised of a wettability metal material.

7. The holding assembly of claim 6, wherein the wettability metal material is comprised of a solder.

8. The holding assembly of claim 6, wherein the wettability metal material is comprised of electroplating tin-lead.

9. The holding assembly of claim 1, wherein the holder further comprises a plurality of protrusions for aligning the holding assembly with an automatic tsop(II) 44-pins testing apparatus.

10. The holding assembly of claim 1, further comprising a cover plate for covering the bottom plate, the guide rail and the holder.

11. The holding assembly of claim 10, wherein the cover plate covering the bottom plate, and the guide-rail on the bottom plate are located on a heating plate for being heated at a temperature when the holder is located on the bottom plate, and wherein the tested chip can be departed from the inner leads when the temperature is higher than the second melting point.

12. The holding assembly of claim 1, wherein the adhesive material is comprised of a tape.

* * * * *